United States Patent [19]

Uchida

[11] Patent Number: 5,641,986

[45] Date of Patent: Jun. 24, 1997

[54] SEMICONDUCTOR DEVICE

[75] Inventor: Toshiya Uchida, Kawasaki, Japan

[73] Assignee: Fujitsu Limited, Kawasaki, Japan

[21] Appl. No.: 587,965

[22] Filed: Jan. 17, 1996

[30] Foreign Application Priority Data

Jun. 16, 1995 [JP] Japan .................................. 7-150045

[51] Int. Cl.⁶ .................................................. H01L 29/00
[52] U.S. Cl. ........................... 257/532; 327/390; 327/589; 327/536; 326/88
[58] Field of Search .............................. 257/313, 296, 257/532; 326/88; 327/390, 536, 589

[56] References Cited

U.S. PATENT DOCUMENTS

| | | | |
|---|---|---|---|
| 3,911,466 | 10/1975 | Lattin | 257/296 |
| 5,475,335 | 12/1995 | Merrill et al. | 327/536 |
| 5,546,296 | 8/1996 | Savignac et al. | 363/60 |

*Primary Examiner*—Ngân V. Ngô
*Assistant Examiner*—Allan R. Wilson
*Attorney, Agent, or Firm*—Staas & Halsey

[57] ABSTRACT

A semiconductor device includes an increase voltage generation circuit generating an increased voltage having a higher potential than a high potential of a power-supply voltage externally supplied. In the device, an increased voltage stabilizing capacitor is connected between the increased voltage and the high potential of the power-supply voltage, and stabilizes the increased voltage.

12 Claims, 10 Drawing Sheets nMOS TRANSISTOR

SEMICONDUCTOR DEVICE

BACKGROUND OF THE INVENTION

1. Field of the Invention

The present invention generally relates to a semiconductor device and more particularly, to a semiconductor device including an increase voltage generation circuit which generates an increased voltage greater than an externally-supplied power-supply voltage.

2. Description of the Related Art

Recently, in semiconductor devices, to reduce power consumption and to improve device reliability, a power-supply voltage has a tendency to decrease. Therefore, for example, in a semiconductor memory, a voltage difference between voltages for data 1 and 0 also decreases.

Now, for example, in a dynamic random access memory (referred to as DRAM, hereinafter) which is a kind of semiconductor memory, for a transistor for transmitting a memory cell (transmission transistor), an nMOS transistor is commonly used.

In such a DRAM, when logic information "1" is written into the memory cell, to reduce a threshold loss due to the transmission transistor in the memory cell, it is necessary to apply to a gate of the transmission transistor a voltage higher than a power-supply voltage supplied from outside the memory.

Therefore, in the semiconductor device which needs the voltage higher than the externally-supplied power-supply voltage, an increase voltage generation circuit is provided, the circuit generating an increased voltage which is produced by increasing the externally-supplied power-supply voltage.

The increased voltage generation circuit typically produces an increased voltage by performing a pumping operation for a capacitor. In the increased voltage generation circuit, a current-supply ability is relatively low. Therefore, in practical use, an increased voltage stabilizing capacitor having a large capacitance value is provided. In that configuration, electric charge is stored in the increased voltage stabilizing capacitor, a portion of the electric charge is used from the capacitor as necessary, and the capacitor is filled again.

FIG. 1 shows a block diagram of a main part of a prior-art semiconductor device having the increased voltage generation circuit. In a prior-art semiconductor device 1 shown in FIG. 1, high potential VCC of a power-supply voltage is externally applied to an external port 2, and to an external port 3, low potential VSS of the power-supply voltage is externally applied.

A VCC-power-supply line 4 supplies to internal circuits the high potential VCC of the power-supply voltage which is applied through the external port 2. A VSS-power-supply line 5 supplies to the internal circuits the low potential VSS of the power-supply voltage which is applied through the external port 3.

The prior-art semiconductor device shown in FIG. 1 includes an increase voltage generation circuit 6 generating an increased voltage SVCC produced by increasing the high potential VCC of the power-supply voltage, a SVCC-voltage line 7 for supplying to the internal circuits the increased voltage SVCC produced from the increase voltage generation circuit 6, and an increased voltage stabilizing capacitor 8 for stabilizing the increased voltage SVCC.

The prior-art semiconductor device further includes a circuit 9 supplied with the high potential VCC and low potential VSS of the externally-supplied power-supply voltage, and a circuit 10 supplied with the high potential VCC and low potential VSS of the externally-supplied power-supply voltage and the increased voltage SVCC produced from the increase voltage generation circuit 6.

In the prior-art semiconductor device 1 having the increase voltage generation circuit 6, for the stabilization of the increased voltage SVCC, the increased voltage stabilizing capacitor 8 is connected between the SVCC-voltage line 7 and the VSS-power-supply line 5.

The increased voltage stabilizing capacitor 8 is typically formed by using a gate insulating film of a MOS transistor. However, an area of the gate insulating film forming the increased voltage stabilizing capacitor 8 is relatively large. Therefore, a possibility of fault generation in the increased voltage stabilizing capacitor 8 is extremely large.

Although, in the above-mentioned configuration of the prior-art semiconductor device, a high voltage of the increased voltage SVCC is applied to the gate insulating film forming the increased voltage stabilizing capacitor 8. Therefore, there is a problem in that the increased voltage stabilizing capacitor 8 may be easily destroyed.

SUMMARY OF THE INVENTION

It is an object of the present invention to provide a semiconductor device having an increase voltage generation circuit with an increased voltage stabilizing capacitor. In the device, even if a dielectric layer between electrodes of the increased voltage stabilizing capacitor has a fault, the increased voltage stabilizing capacitor may not be destroyed. Therefore, reliability of the semiconductor device may be improved. This permits the disadvantages described above to be eliminated.

The object described above is achieved by a semiconductor device comprising: an increase voltage generation circuit generating an increased voltage having a higher potential than a high potential of a power-supply voltage externally supplied; and an increased voltage stabilizing capacitor, connected between the increased voltage and the high potential of the power-supply voltage, whereby stabilizing the increased voltage.

The object described above is also achieved by the semiconductor device mentioned above, wherein the increased voltage stabilizing capacitor is provided between a first electrode of a conductive layer and a second electrode of a semiconductor region placed under the conductive layer, the semiconductor region being in an inversion state.

The object described above is also achieved by the semiconductor device mentioned above, wherein the increased voltage stabilizing capacitor is provided between a first electrode of a conductive layer and a second electrode of a semiconductor region placed under the conductive layer, the semiconductor region being in an accumulation state.

According to the above-mentioned semiconductor device, the one port of the increased voltage stabilizing capacitor is provided with the increased voltage, and the other port thereof is provided with the high potential which is higher than the low potential of the power-supply voltage. In the prior-art semiconductor device, the increased voltage stabilizing capacitor is connected between the increased voltage and the low potential of the power-supply voltage. Therefore, a voltage difference between electrodes of the increased voltage stabilizing capacitor may be reduced as compared to the prior-art semiconductor device.

Accordingly, even if a dielectric layer between the electrodes of the increased voltage stabilizing capacitor has a fault, the increased voltage stabilizing capacitor is prevented from being be destroyed. Therefore, reliability of the semiconductor device may be improved.

The object described above is also achieved by the semiconductor device mentioned above, wherein the increased voltage stabilizing capacitor further comprises: one port connected to an increase voltage line for supplying the increased voltage; and the other port connected to a position in a high-potential power-supply line, the position being adjacent to an internal port being provided with the high potential of the power-supply voltage.

The object described above is also achieved by the semiconductor device mentioned above, wherein the semiconductor device further comprises a high-potential stabilizing capacitor for stabilizing the high potential of the power-supply voltage, the high-potential stabilizing capacitor being connected between a high-potential power-supply line for supplying the high potential of the power-supply voltage and a low-potential power-supply line for supplying low potential of the power-supply voltage.

The object described above is also achieved by the semiconductor device mentioned above, wherein the increased voltage stabilizing capacitor comprises: one port connected to an increase voltage line for supplying the increased voltage; and another port connected to an internal port for being provided with the high potential of the power-supply voltage, through a high-potential power-supply line provided for the increased voltage stabilizing capacitor.

The object described above is also achieved by the semiconductor device mentioned above, wherein the increased voltage stabilizing capacitor comprises: one port connected to an increase voltage line for supplying the increased voltage; and another port connected to an internal port which is provided for the increased voltage stabilizing capacitor and is provided with the high potential of the power-supply voltage, through a high-potential power-supply line provided for the increased voltage stabilizing capacitor.

The object described above is also achieved by the semiconductor device mentioned above, wherein the semiconductor device further comprises a lead branch of a lead for the high potential of the power-supply voltage, the lead branch being provided for the increased voltage stabilizing capacitor, and being connected to the internal port provided for the increased voltage stabilizing capacitor and is provided with the high potential of the power-supply voltage.

According to the above-mentioned semiconductor device, a point for supplying the high potential of the power-supply voltage to the increased voltage stabilizing capacitor is closer to the external power supply.

Therefore, noise generated in the high-potential power-supply line due to operation of the internal circuits is further prevented from influencing the increased voltage stabilizing capacitor. Accordingly, the voltage fluctuation of the increased voltage due to the noise generated in the high-potential power-supply line may be reduced to less than that of prior-art semiconductor device.

Other objects and further features of the present invention will be apparent from the following detailed description when read in conjunction with the accompanying drawings.

DESCRIPTION OF THE PREFERRED EMBODIMENTS

Figure 2:
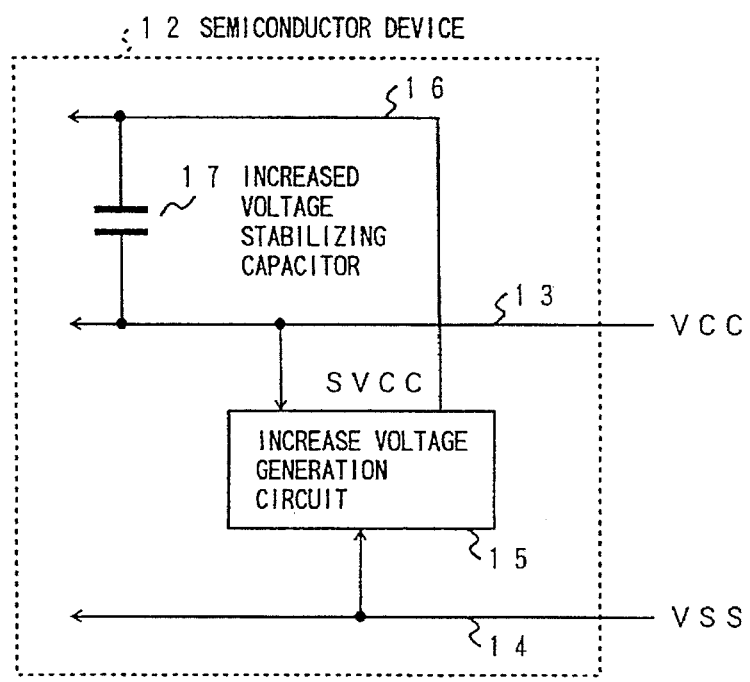
FIG. 2 shows a block diagram of a main part of a semiconductor device according to the present invention.

First, a description will be given of a principle of a semiconductor device according to the present invention, by referring to FIG. 2. FIG. 2 shows a block diagram of a main part of the semiconductor device according to the present invention.

In a semiconductor device 12 shown in FIG. 2, a VCC-power-supply line 13 supplies high potential VCC of an externally-supplied power-supply voltage to internal circuits, and a VSS-power-supply line 14 supplies low potential VSS of the externally-supplied power-supply voltage to the internal circuits.

The semiconductor device shown in FIG. 2 includes an increase voltage generation circuit 15 generating an increased voltage SVCC produced by rising the high potential VCC of the power-supply voltage, a SVCC-voltage line 16 for supplying the increased voltage SVCC produced from the increase voltage generation circuit 15 to the internal circuits, and an increased voltage stabilizing capacitor 17 for stabilizing the increased voltage SVCC produced from the increase voltage generation circuit 15.

In the semiconductor device according to the present invention, to one of ports of the increased voltage stabilizing capacitor 17, the increased voltage SVCC is applied, and to the other of the ports, the high potential VCC of the power-supply voltage is applied. Namely, the increased voltage stabilizing capacitor 17 is connected between the SVCC-voltage line 16 and the VCC-power-supply voltage line 13.

Figure 1:
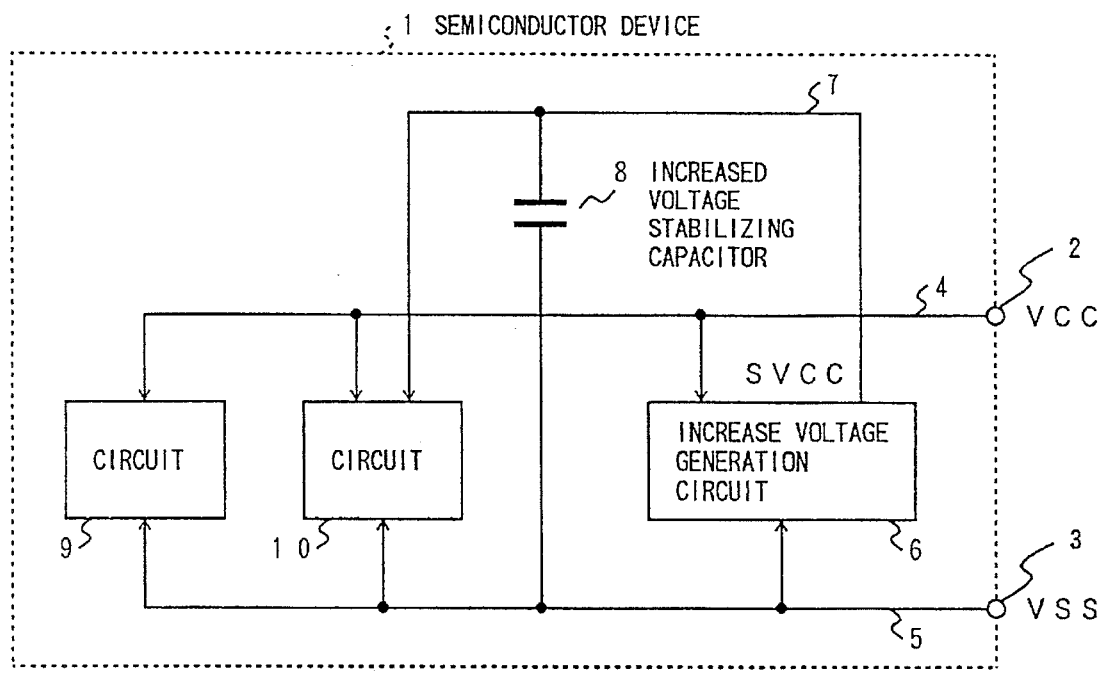
FIG. 1 shows a block diagram of a main part of a prior-art semiconductor device having an increase voltage generation circuit.

In the above-mentioned configuration of the semiconductor device according to the present invention, the one port of the increased voltage stabilizing capacitor 17 is provided with the increased voltage SVCC, and the other port thereof is provided with the high potential VCC higher than the low potential VSS. In the prior-art semiconductor device, the increased voltage stabilizing capacitor is connected between the increased voltage SVCC and the low potential VSS. Therefore, a voltage difference between electrodes of the increased voltage stabilizing capacitor 17 is reduced as compared to the prior-art semiconductor device shown in FIG. 1.

Accordingly, even if a dielectric layer between the electrodes of the increased voltage stabilizing capacitor 17 has a fault, the increased voltage stabilizing capacitor 17 is prevented from being be destroyed. Therefore, reliability of the semiconductor device may be improved.

Next, descriptions will be given of several embodiments of the semiconductor device according to the present invention, by referring to FIG. 3 and FIG. 11. The descriptions will be given in cases where the present invention is applied to lead-on-chip-type DRAMs.

First Embodiment (FIG. 3 to FIG. 5B)

Figure 3:
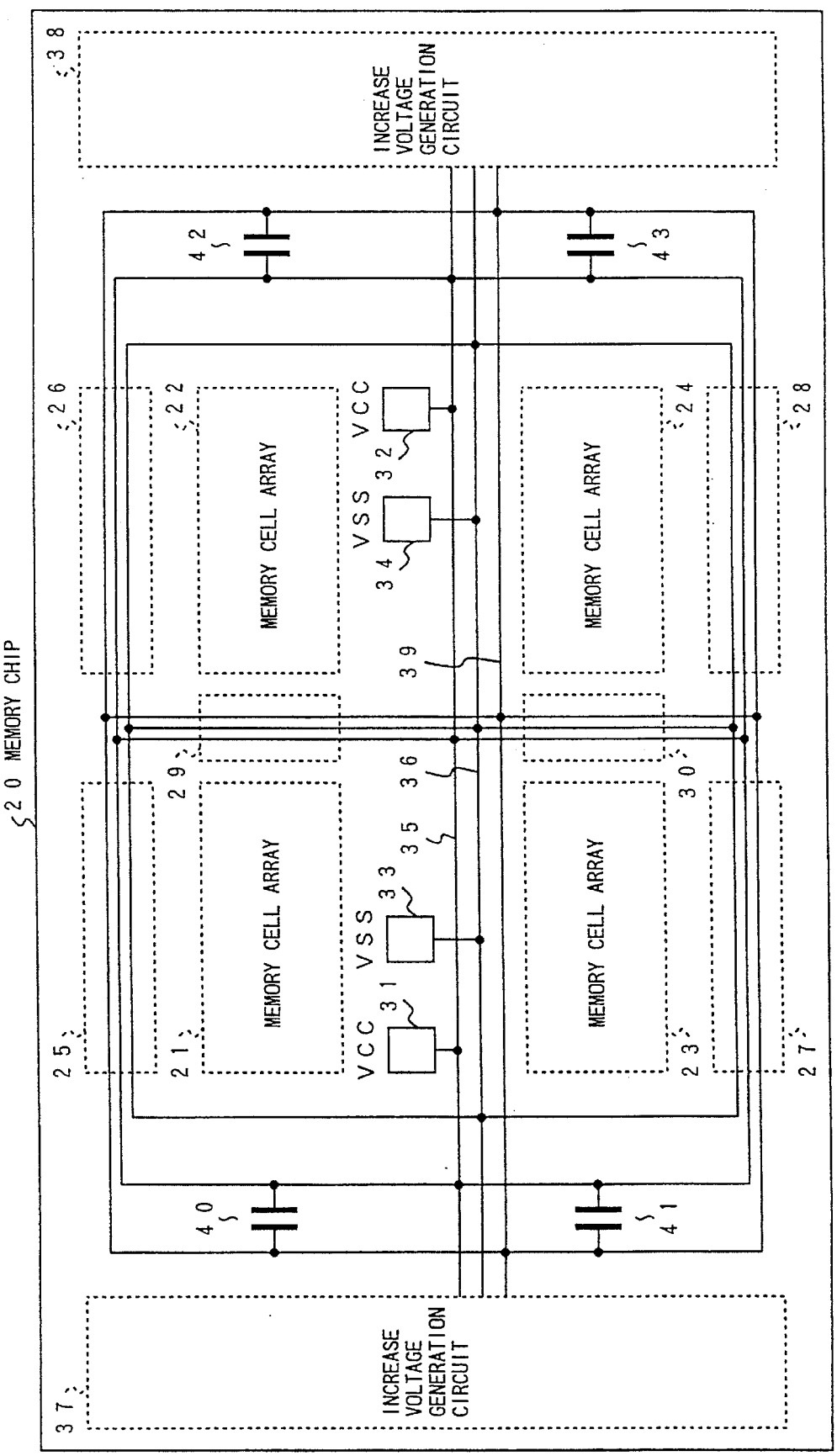
FIG. 3 shows a plan view of a main part of a first embodiment of a memory according to the present invention.

FIG. 3 shows a plan view of a main part of a first embodiment of the memory according to the present invention. In FIG. 3, a memory chip 20 includes memory cell arrays 21 to 24, peripheral circuits 25 to 28 such as a raw decoder, and peripheral circuits 29 and 30 such as a column decoder.

The memory chip 20 further includes bonding pads 31 and 32 constructing internal ports to which the high potential VCC of the externally-supplied power-supply voltage is supplied, and bonding pads 33 and 34 constructing internal ports to which the low potential VSS of the power-supply voltage is supplied.

In FIG. 3, a VCC-power-supply line 35 supplies to the internal circuits the high potential VCC of the power-supply voltage externally supplied through the bonding pads 31 and 32. A VSS-power-supply line 36 supplies to the internal circuits the low potential VSS of the power-supply voltage externally supplied through the bonding pads 33 and 34.

The memory chip 20 shown in FIG. 3 includes increase voltage generation circuits 37 and 38 generating an increased voltage SVCC produced by increasing the high potential VCC of the power-supply voltage, a SVCC-voltage line 39 for supplying the increased voltage SVCC produced from the increased voltage generation circuits 37 and 38 to the internal circuits, and increased voltage stabilizing capacitors 40 to 43 for stabilizing the increased voltage SVCC.

In the increased voltage stabilizing capacitors 40 and 41, one port of each capacitor is connected to the SVCC-voltage line 39, and the other port of each capacitor is connected to a position adjacent to the bonding pad 31 in the VCC-power-supply line 35.

As that position is close to the bonding pad 31, resistance between the bonding pad 31 and the position in the VCC-power-supply line 35 may be reduced. Therefore, a loss across the resistance may be reduced. It is preferred that a connection point between each of the increased voltage stabilizing capacitors 40, 41 and the VCC-power-supply line 35 is closer to the bonding pad 31.

In the increased voltage stabilizing capacitors 42 and 43, one port of each capacitor is connected to the SVCC-voltage line 39, and the other port of each capacitor is connected to a position adjacent to the bonding pad 32 in the VCC-power-supply line 35.

Also in this case, as that position is close to the bonding pad 32, resistance between the bonding pad 32 and that position in the VCC-power-supply line 35 may be reduced. Therefore, a loss across the resistance may be reduced. It is preferred that a connection point between each of the increased voltage stabilizing capacitors 42, 43 and the VCC-power-supply line 35 is closer to the bonding pad 32.

Figure 4A:
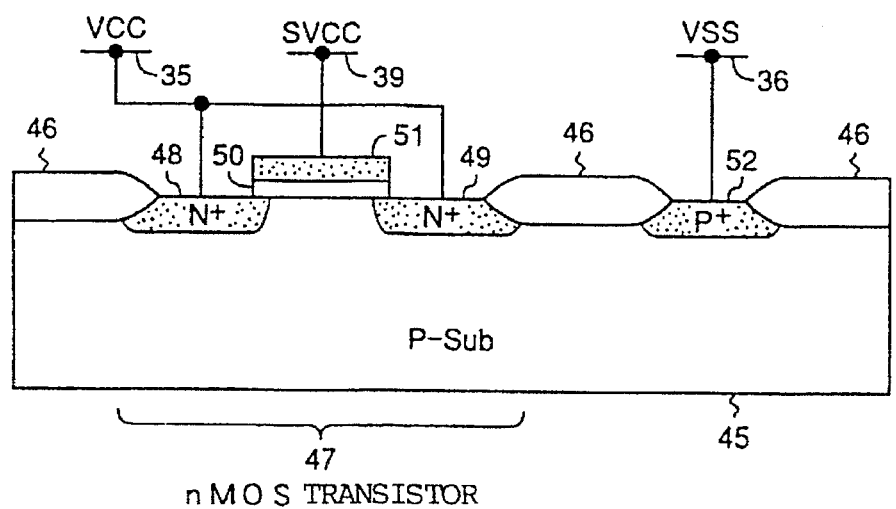
FIG. 4A shows a cross-sectional view of one embodiment of increased voltage stabilizing capacitors shown in FIG. 3.
Figure 4B:
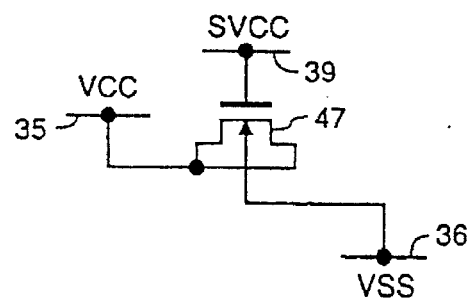
FIG. 4B shows an equivalent circuit of the increased voltage stabilizing capacitor shown in FIG. 4A.

FIG. 4A shows a cross-sectional view of one embodiment of the increased voltage stabilizing capacitors 40 to 43, and FIG. 4B shows an equivalent circuit of the increased voltage stabilizing capacitor shown in FIG. 4A.

In FIG. 4A, a numeral "45" indicates a P-type silicon substrate, a numeral "46" indicates a field oxide film formed by silicon dioxide, and a numeral "47" indicates an nMOS transistor. The nMOS transistor 47 has a source 48 formed by an N-type diffusion layer, a drain 49 formed by an N-type diffusion layer, a gate insulating film 50 formed by silicon dioxide, and a gate 51 formed by polysilicon. A numeral "52" indicates a contact layer formed by a P-type diffusion layer.

In this case, each of the increased voltage stabilizing capacitors 40 to 43 is constructed such that the gate 51 is used for one electrode of the capacitor, the source 48 and the drain 49 are used for the other electrode of the capacitor, and the gate insulating film 50 is used for a dielectric layer.

Figure 5A:
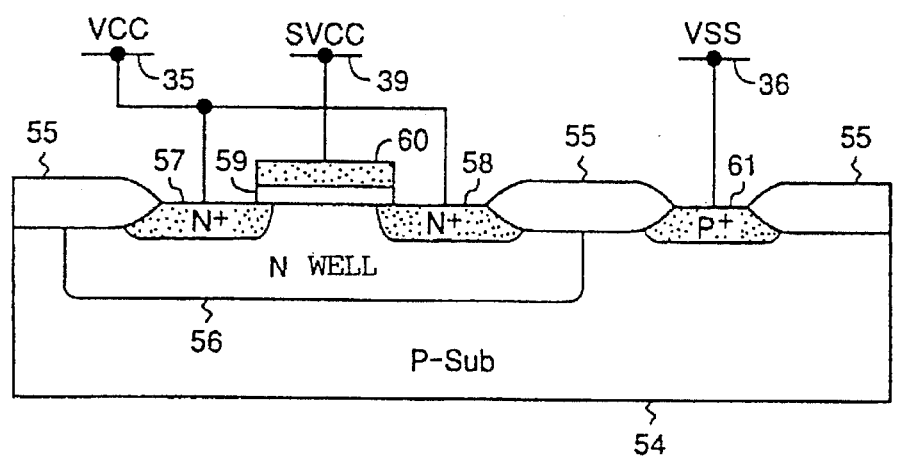
FIG. 5A shows a cross-sectional view of another embodiment of the increased voltage stabilizing capacitors shown in FIG. 3.
Figure 5B:
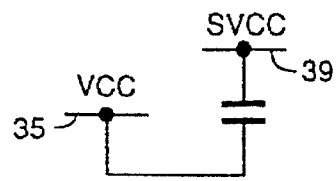
FIG. 5B shows an equivalent circuit of the increased voltage stabilizing capacitor shown in FIG. 5A.

FIG. 5A shows a cross-sectional view of another embodiment of the increased voltage stabilizing capacitors 40 to 43, and FIG. 5B shows an equivalent circuit of the increased voltage stabilizing capacitor shown in FIG. 5A.

In FIG. 5A, a numeral "54" indicates a P-type silicon substrate, a numeral "55" indicates a field oxide film formed by silicon dioxide, and a numeral "56" indicates an N well. The increased voltage stabilizing capacitor further has N-type diffusion layers 57 and 58, a gate insulating film 59 formed by silicon dioxide, and a gate 60. A numeral "61" indicates a contact layer formed by a P-type diffusion layer.

In this case, each of the increased voltage stabilizing capacitors 40 to 43 is constructed such that the gate 60 is used for one electrode of the capacitor, the N well 56 and the N-type diffusion layers 57 and 58 are used for the other electrode of the capacitor, and the gate insulating film 59 is used for a dielectric layer.

In the above-described increased voltage stabilizing capacitors, when the increased voltage stabilizing capacitors 40 to 43 are formed as shown in FIG. 4A, the increased voltage SVCC needs to increase more than the high potential VCC of the power-supply voltage+a threshold voltage VTH of the nMOS transistor 47.

However, during a transition period when the power-supply voltage is initially supplied to each circuit, the increased voltage SVCC is not increased so high as compared to the high potential VCC of the power-supply voltage, or is lower than the high potential VCC. Further, each capacitance value of the increased voltage stabilizing capacitors 40 to 43 is a channel which is formed between the gate 51 and a pair of the source 48 and the drain 49, and is generated according to an applied voltage between them. In the above configuration having the transistor, a channel part of the P-substrate 45 is in an inversion state.

Therefore, in this case, since the applied voltage between the gate 51 and the pair of the source 48 and the drain 49 is small, there is a problem in that each capacitance value of the increased voltage stabilizing capacitors 40 to 43 is relatively low.

In the above discussion, the nMOS transistor 47 is assumed to be an enhancement-type transistor. On the contrary, when the nMOS transistor 47 is formed as a depletion-type transistor, the increased voltage stabilizing capacitors 40 to 43 may be generated even if the applied voltage between the gate 51 and the pair of the source 48 and the drain 49 is relatively small. Therefore, from the transition period, a relatively large capacitance of the increased voltage stabilizing capacitors 40 to 43 may be obtained.

Furthermore, when the increased voltage stabilizing capacitors 40 to 43 are formed as shown in FIG. 5A, the increased voltage stabilizing capacitors 40 to 43 may also be generated in the N well 56 even if the applied voltage between the gate 60 and the N-type diffusion layers 57, 58 is relatively small. In this case, a semiconductor region of the N well 56 is used in an accumulation state.

Therefore, during the transition period when the power-supply voltage is initially supplied to each circuit, even if the increased voltage SVCC is not increased so high as compared to the high potential VCC of the power-supply voltage, or is lower than the high potential VCC, a large capacitance value in the increased voltage stabilizing capacitors 40 to 43 may be obtained.

As mentioned above, in the first embodiment of the memory according to the present invention, the increased voltage stabilizing capacitors 40 to 43 are respectively connected between the SVCC-voltage line 39 and the VCC-power-supply line 35. Therefore, a voltage across each of the increased voltage stabilizing capacitors 40 to 43 may be reduced.

Accordingly, even if the gate insulating film between the electrodes of each of the increased voltage stabilizing capacitors 40 to 43 has a fault, the increased voltage stabilizing capacitors 40 to 43 are prevented from being destroyed. Therefore, reliability of the semiconductor device may be improved.

Furthermore, in the first embodiment, the other port of each increased voltage stabilizing capacitor 40, 41 is connected to the position in the VCC-power-supply line 35 where the resistance between the bonding pad 31 and its position is less. The other port of each increased voltage stabilizing capacitor 42, 43 is connected to the position in the VCC-power-supply line 35 where the resistance between the bonding pad 32 and its position is less.

Therefore, noise generated in the VCC-power-supply line 35 due to operation of the internal circuits 25 to 30 is prevented from influencing the increased voltage stabilizing capacitors 40 to 43. Accordingly, voltage fluctuation of the increased voltage SVCC due to the noise generated in the VCC-power-supply line 35 may be reduced.

Figure 6:
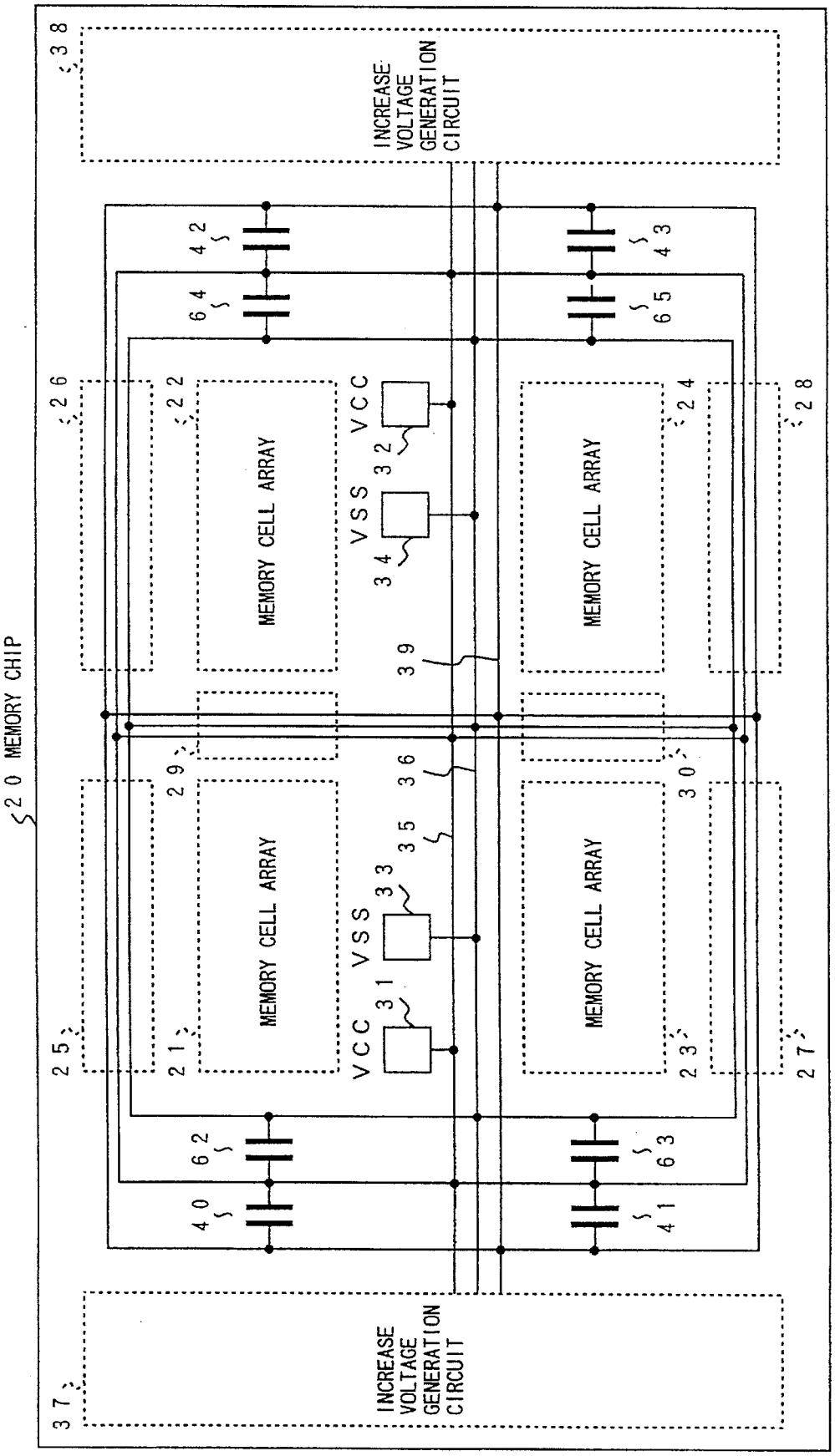
FIG. 6 shows a plan view of a main part of a second embodiment of the memory according to the present invention.

Second Embodiment (FIG. 6)

FIG. 6 shows a plan view of a main part of a second embodiment of the memory according to the present invention. In the second embodiment, high-potential stabilizing capacitors 62 to 65 are connected between the VCC-power-supply line 35 and the VSS-power-supply line 36 as compared to the first embodiment shown in FIG. 3. The remaining configuration of the second embodiment is the same as that of the first embodiment.

In the second embodiment, in the same way as the first embodiment, since each of the increased voltage stabilizing capacitors 40 to 43 is connected between the SVCC-voltage line 39 and the VCC-power-supply line 35, the voltage across each of the increased voltage stabilizing capacitors 40 to 43 may be reduced.

Accordingly, even if the gate insulating film between the electrodes of each of the increased voltage stabilizing capacitors 40 to 43 has a fault, the increased voltage stabilizing capacitors 40 to 43 are prevented from being destroyed. Therefore, reliability of the semiconductor device may be improved.

Further, in the second embodiment, different from the first embodiment, the high-potential stabilizing capacitors 62 to 65 are respectively connected between the VCC-power-supply line 35 and the VSS-power-supply line 36.

Therefore, the noise generated in the VCC-power-supply line 35 due to the operation of the internal circuits 25 to 30 is further prevented from influencing the increased voltage stabilizing capacitors 40 to 43 as compared with the first embodiment. Accordingly, the voltage fluctuation of the increased voltage SVCC due to the noise generated in the VCC-power-supply line 35 may be reduced less as compared with the first embodiment.

Figure 7:
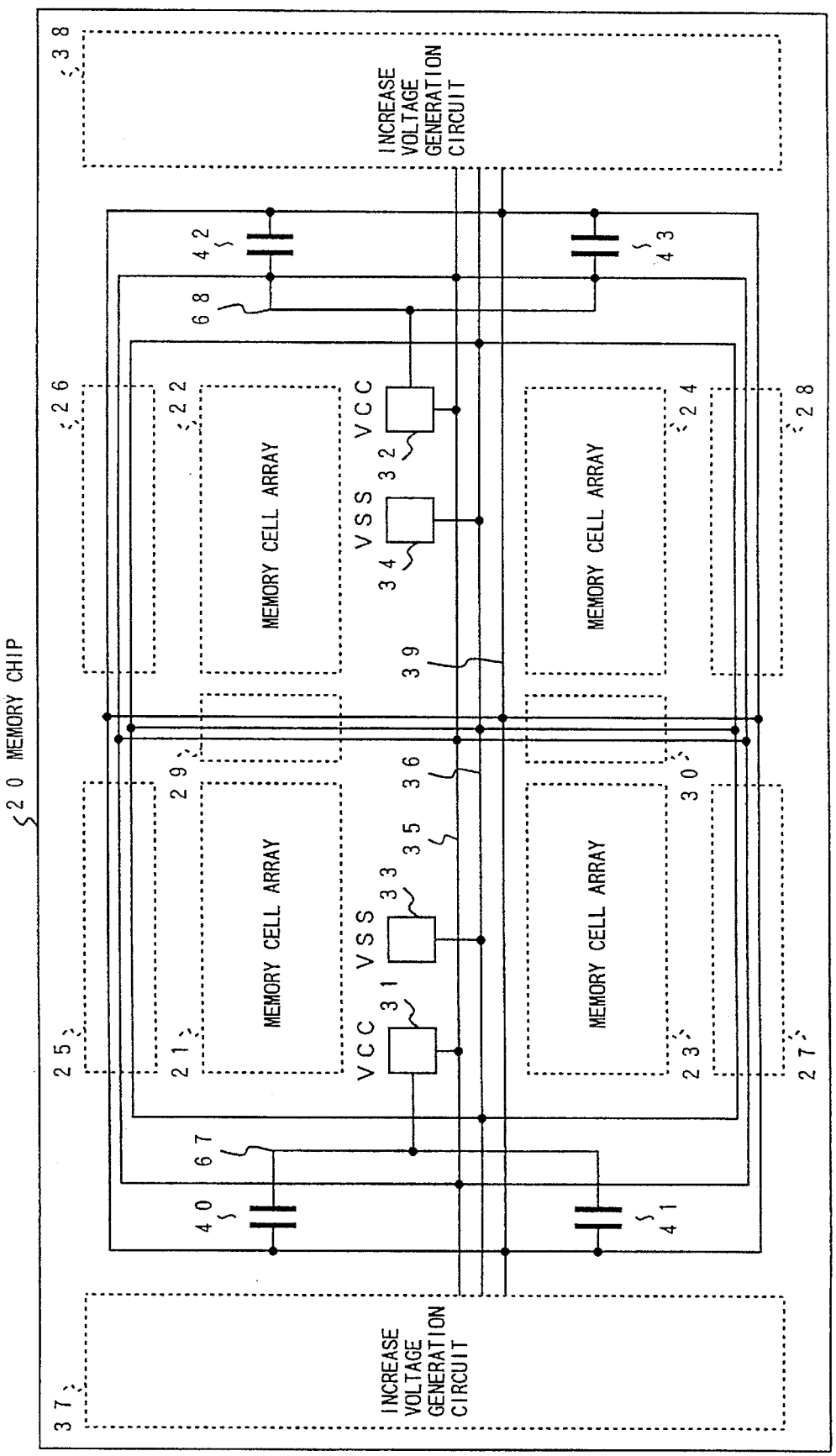
FIG. 7 shows a plan view of a main part of a third embodiment of the memory according to the present invention.

Third Embodiment (FIG. 7)

FIG. 7 shows a plan view of a main part of a third embodiment of the memory according to the present invention. In the third embodiment, a VCC-power-supply line 67 is separated from the VCC-power-supply line 35 and is provided for the increased voltage stabilizing capacitors 40 and 41, and a VCC-power-supply line 68 is separated from the VCC-power-supply line 35 and is provided for the increased voltage stabilizing capacitors 42 and 43.

Further, one port of each of the increased voltage stabilizing capacitors 40 and 41 is connected to the SVCC-voltage line 39, and the other port of each of them is connected to the bonding pad 31 through the VCC-power-supply line 67.

The one port of each of the increased voltage stabilizing capacitors 42 and 43 is connected to the SVCC-voltage line 39, and the other port of each of them is connected to the bonding pad 32 through the VCC-power-supply line 68. The remainder is constructed in the same way as the first embodiment shown in FIG. 3.

According to the third embodiment, in the same way as the first embodiment, the one port of each of the increased voltage stabilizing capacitors 40 to 43 is connected to the SVCC-voltage line 39, and the other port of each of them is connected to the VCC-power-supply line 35. Therefore, the voltage applied between the electrodes of each of the increased voltage stabilizing capacitors 40 to 43 may be reduced.

Accordingly, even if the gate insulating film between the electrodes of each of the increased voltage stabilizing capacitors 40 to 43 has a fault, the increased voltage stabilizing capacitors 40 to 43 are prevented from being be destroyed. Therefore, reliability of the semiconductor device may be improved.

Further, in the third embodiment, different from the first embodiment, the other port of each of the increased voltage stabilizing capacitors 40 and 41 is connected to the bonding pad 31 through the VCC-power-supply line 67, and the other port of each of the increased voltage stabilizing capacitors 42 and 43 is connected to the bonding pad 32 through the VCC-power-supply line 68. Therefore, a separation point for supplying the high potential VCC of the power-supply voltage to the increased voltage stabilizing capacitors 40 to 43 is closer to the external power supply as compared to the first embodiment.

Therefore, the noise generated in the VCC-power-supply line 35 due to the operation of the internal circuits 25 to 30 is further prevented from influencing the increased voltage stabilizing capacitors 40 to 43 as compared with the first embodiment. Accordingly, the voltage fluctuation of the increased voltage SVCC due to the noise generated in the VCC-power-supply line 35 may be reduced as compared with the first embodiment.

Also in the third embodiment, in the same way as the second embodiment, between the VCC-power-supply line 35 and the VSS-power-supply line 36, the high potential stabilizing capacitors 62 to 65 may be provided.

Figure 8:
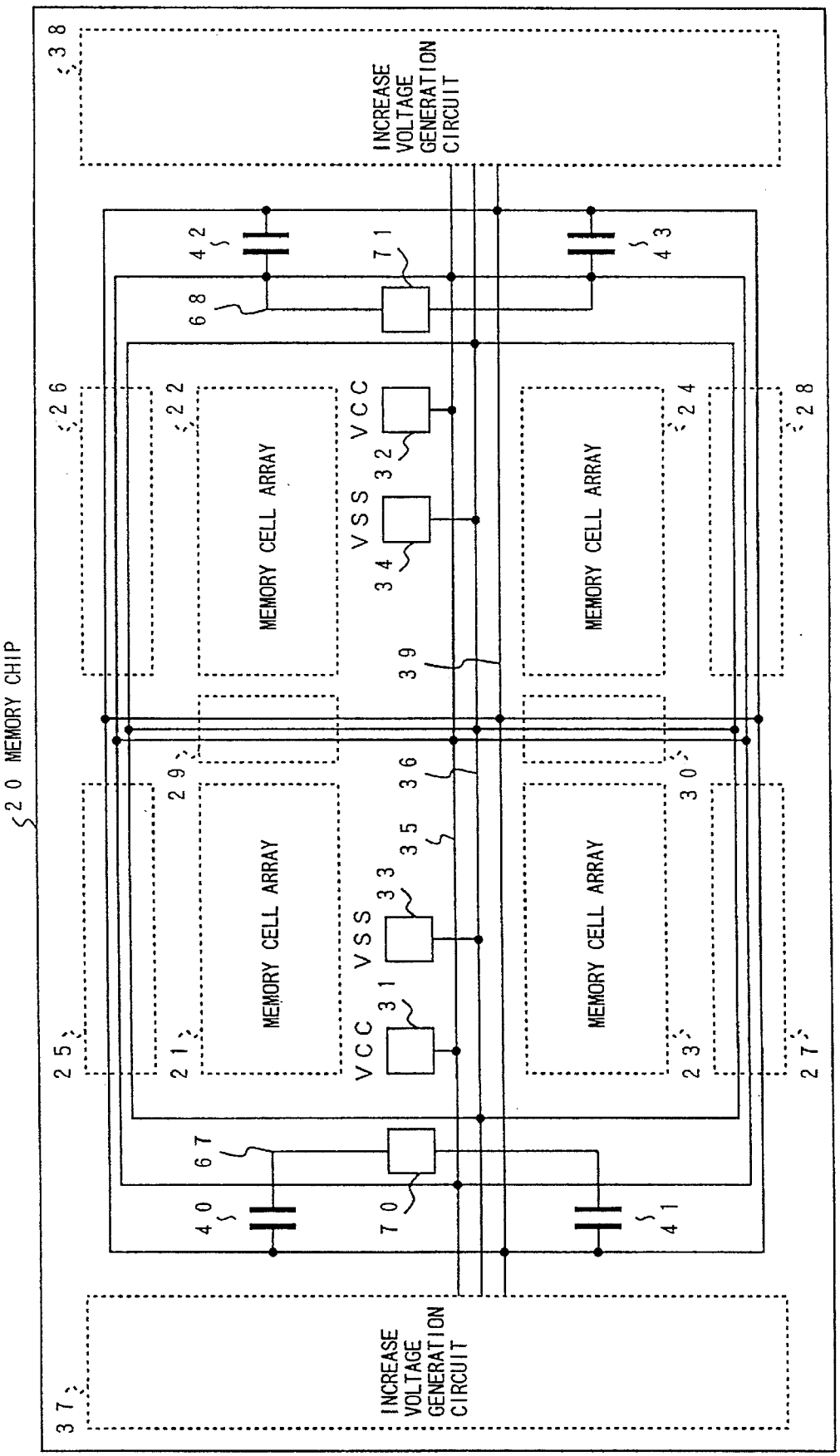
FIG. 8 shows a plan view of a main part of a fourth embodiment of the memory according to the present invention.
Figure 9:
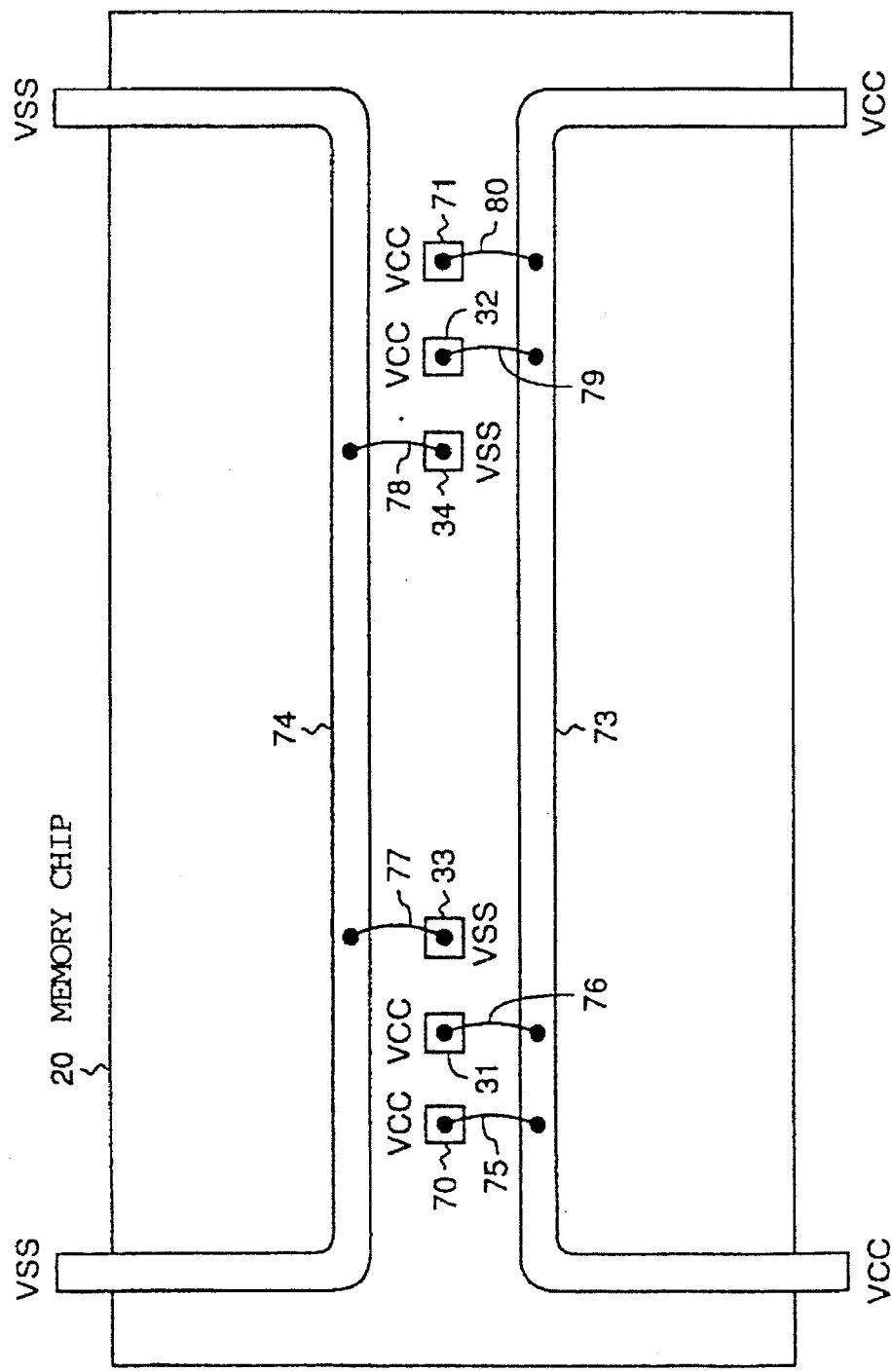
FIG. 9 shows a plan view for explaining connections between bonding pads and a lead frame in the fourth embodiment of the memory shown in FIG. 8.

Fourth Embodiment (FIG. 8 and FIG. 9)

FIG. 8 shows a plan view of a main part of a fourth embodiment of the memory according to the present invention. Also, in the fourth embodiment, the VCC-power-supply line 67 is separated from the VCC-power-supply line 35 and is provided for the increased voltage stabilizing capacitors 40 and 41, and the VCC-power-supply line 68 is separated from the VCC-power-supply line 35 and is provided for the increased voltage stabilizing capacitors 42 and 43.

Further, as bonding pads for supplying the high potential VCC of the power-supply voltage, in addition to the bonding pads 31 and 32, bonding pads 70 and 71 are provided.

One port of each of the increased voltage stabilizing capacitors 40 and 41 is connected to the SVCC-voltage line 39, and the other port of each of the capacitors 40 and 41 is connected to the bonding pad 70 through the VCC-power-supply line 67.

One port of each of the increased voltage stabilizing capacitors 42 and 43 is connected to the SVCC-voltage line 39, and the other port of each of the capacitors is connected to the bonding pad 71 through the VCC-power-supply line 68.

FIG. 9 shows a plan view for explaining connections between bonding pads and a lead frame in the fourth embodiment of the memory shown in FIG. 8. In particular, FIG. 9 shows connections between the bonding pads 31, 32, 70 and 71 for the high potential VCC of the power-supply voltage and a lead 73 for the high potential VCC of the power-supply voltage, and connections between the bonding pads 33 and 34 for the low potential VSS of the power-supply voltage and a lead 74 for the low potential VSS of the power-supply voltage.

In the fourth embodiment, the bonding pad 70 is connected to the lead 73 through a bonding wire 75. The bonding pad 31 is connected to the lead 73 through a bonding wire 76. The bonding pad 33 is connected to the lead 74 through a bonding wire 77.

Further, the bonding pad 34 is connected to the lead 74 through a bonding wire 78. The bonding pad 32 is connected to the lead 73 through a bonding wire 79. The bonding pad 71 is connected to the lead 73 through a bonding wire 80.

According to the fourth embodiment, in the same way as the first embodiment, the one port of each of the increased voltage stabilizing capacitors 40 to 43 is connected to the SVCC-voltage line 39, and the other port of each of the capacitors is connected to the VCC-power-supply line 35. Therefore, the voltage applied between the electrodes of each of the increased voltage stabilizing capacitors 40 to 43 may be reduced.

Accordingly, even if the gate insulating film between the electrodes of each of the increased voltage stabilizing capacitors 40 to 43 has a fault, the increased voltage stabilizing capacitors 40 to 43 are prevented from being be destroyed. Therefore, reliability of the semiconductor device may be improved.

Further, in the fourth embodiment, different from the third embodiment, the other port of each of the increased voltage stabilizing capacitors 40 and 41 is connected to the bonding pad 70 through the VCC-power-supply line 67, and the other port of each of the increased voltage stabilizing capacitors 42 and 43 is connected to the bonding pad 71 through the VCC-power-supply line 68. Therefore, a separation point for supplying the high potential VCC of the power-supply voltage to the increased voltage stabilizing capacitors 40 to 43 is closer to the external power supply than the case of the third embodiment.

Therefore, the noise generated in the VCC-power-supply line 35 due to operation of the internal circuits 25 to 30 is further prevented from influencing the increased voltage stabilizing capacitors 40 to 43 as compared with the third embodiment. Accordingly, the voltage fluctuation of the increased voltage SVCC due to the noise generated in the VCC-power-supply line 35 may be reduced as compared with the third embodiment.

Also in the fourth embodiment, in the same way as the second embodiment, between the VCC-power-supply line 35 and the VSS-power-supply line 36, the high potential stabilizing capacitors 62 to 65 may be provided.

Figure 10:
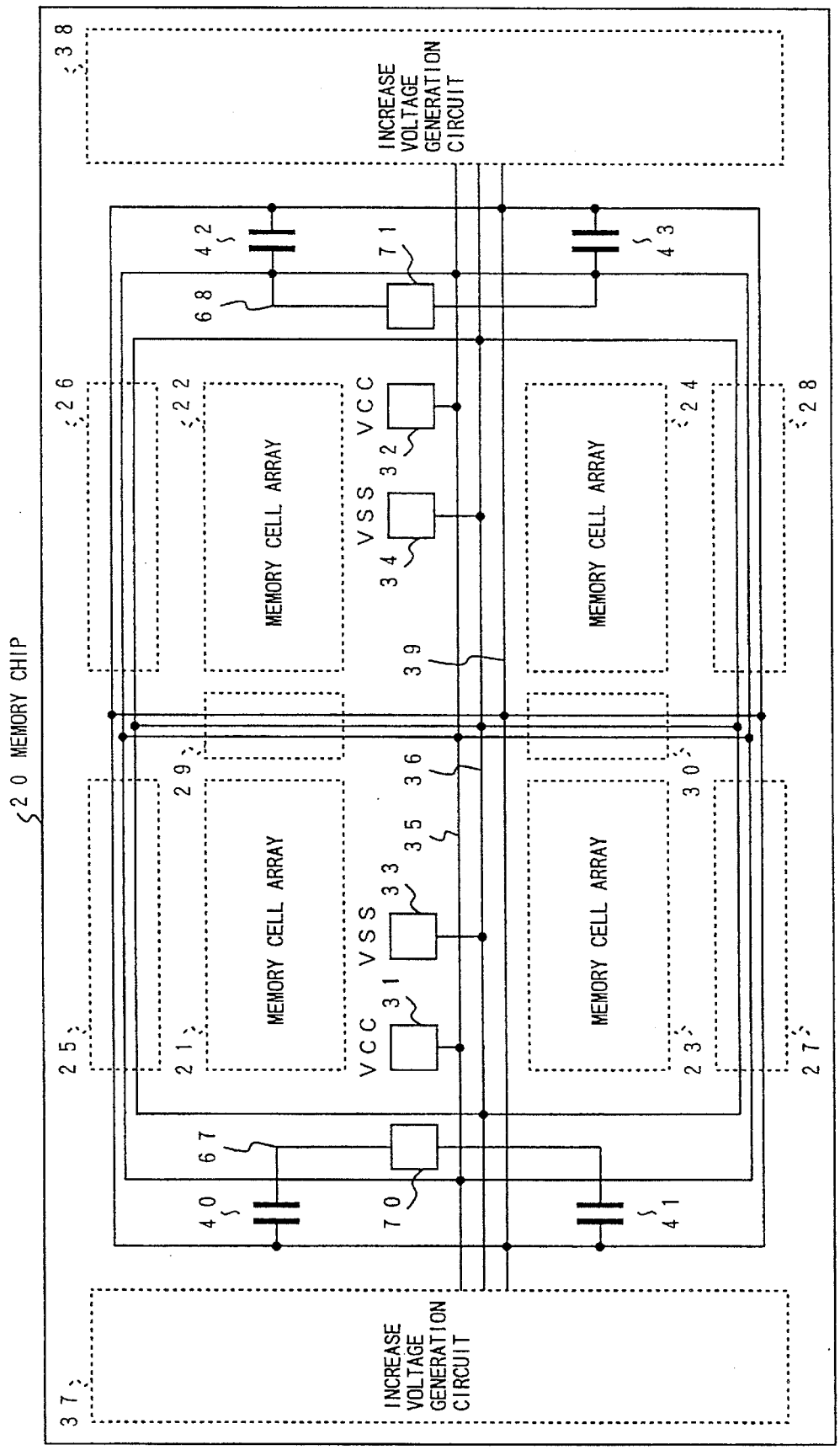
FIG. 10 shows a plan view of a main part of a fifth embodiment of the memory according to the present invention.
Figure 11:
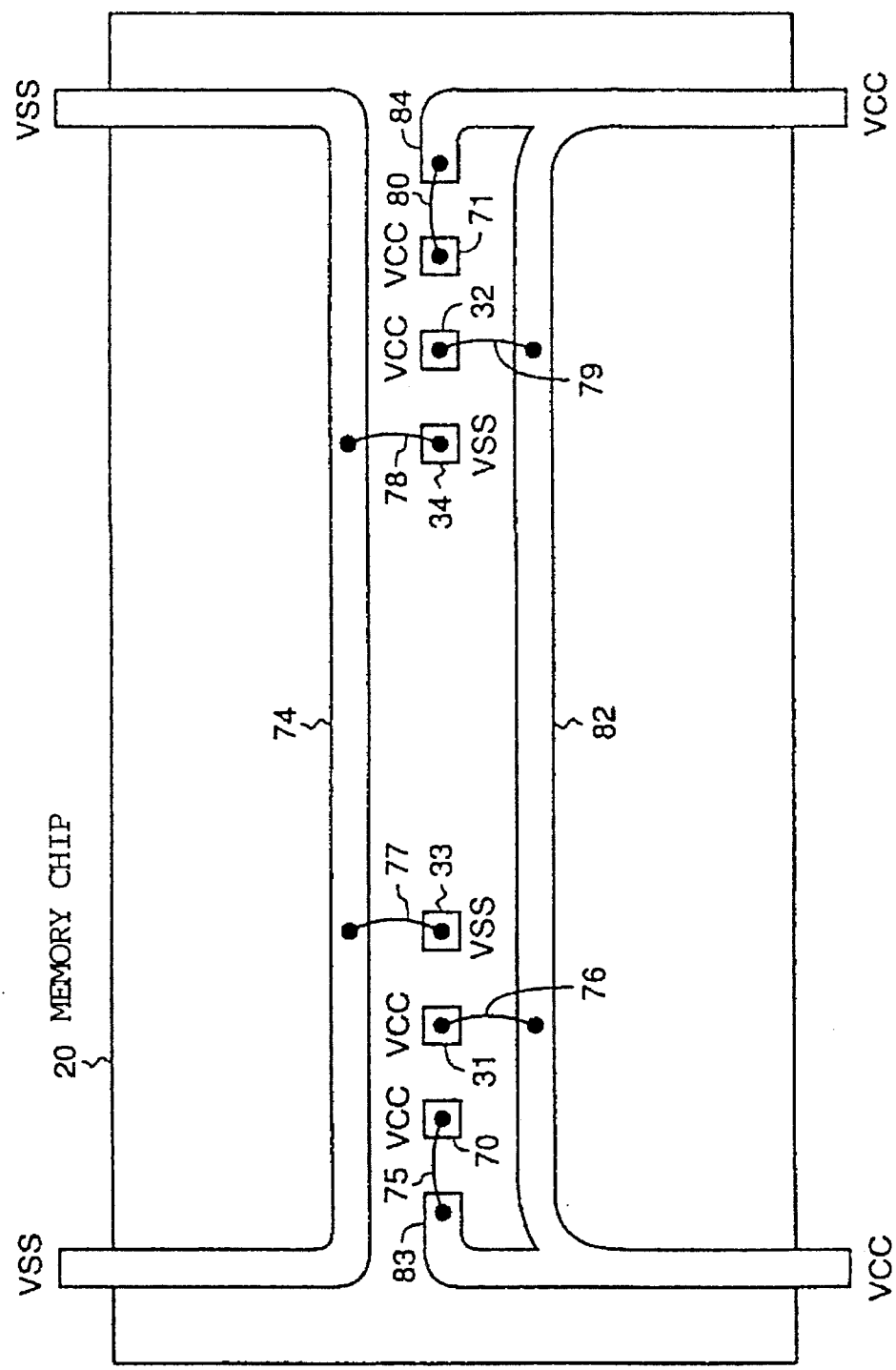
FIG. 11 shows a plan view for explaining connections between bonding pads and a lead frame in the fifth embodiment of the memory shown in FIG. 10.

Fifth Embodiment (FIG. 10 and FIG. 11)

FIG. 10 shows a plan view of a main part of a fifth embodiment of the memory according to the present invention. Also, in the fifth embodiment, the VCC-power-supply line 67 is separated from the VCC-power-supply line 35 and is provided for the increased voltage stabilizing capacitors 40 and 41, and the VCC-power-supply line 68 is separated from the VCC-power-supply line 35 and is provided for the increased voltage stabilizing capacitors 42 and 43.

Further, as bonding pads for supplying the high potential VCC of the power-supply voltage, in addition to the bonding pads 31 and 32, the bonding pads 70 and 71 are also provided.

One port of each of the increased voltage stabilizing capacitors 40 and 41 is connected to the SVCC-voltage line 39, and the other port of each of them is connected to the bonding pad 70 through the VCC-power-supply line 67.

One port of each of the increased voltage stabilizing capacitors 42 and 43 is connected to the SVCC-voltage line 39, and the other port of each of them is connected to the bonding pad 71 through the VCC-power-supply line 68.

FIG. 11 shows a plan view for explaining connections between bonding pads and a lead frame in the fifth embodiment of the memory shown in FIG. 10. In particular, FIG. 11 shows connections between the bonding pads 31, 32, 70 and 71 for the high potential VCC of the power-supply voltage and a lead 82 for the high potential VCC of the power-supply voltage, and connections between the bonding pads 33 and 34 for the low potential VSS of the power-supply voltage and the lead 74 for the low potential VSS of the power-supply voltage.

In the lead 82, lead branches 83 and 84 are provided. The bonding pad 70 is connected to the lead branch 83 through the bonding wire 75. The bonding pad 31 is connected to the lead 82 through the bonding wire 76. The bonding pad 33 is connected to the lead 74 through the bonding wire 77.

Further, the bonding pad 34 is connected to the lead 74 through the bonding wire 78. The bonding pad 32 is connected to the lead 82 through the bonding wire 79. The bonding pad 71 is connected to the lead branch 84 through the bonding wire 80.

According to the fifth embodiment, in the same way as the first embodiment, one port of each of the increased voltage stabilizing capacitors 40 to 43 is connected to the SVCC-voltage line 39, and the other port of each of the capacitors is connected to the VCC-power-supply line 35. Therefore, the voltage applied between the electrodes of each of the increased voltage stabilizing capacitors 40 to 43 may be reduced.

Accordingly, even if the gate insulating film between the electrodes of each of the increased voltage stabilizing capacitors 40 to 43 has a fault, the increased voltage stabilizing capacitors 40 to 43 are prevented from being destroyed. Therefore, reliability of the semiconductor device may be improved.

Further, in the fifth embodiment, different from the fourth embodiment, the bonding pad 70 is connected to the lead branch 83 through the bonding wire 75, and the bonding pad 71 is connected to the lead branch 84 through the bonding wire 80. Therefore, a separation point for supplying the high potential VCC of the power-supply voltage to the increased voltage stabilizing capacitors 40 to 43 is closer to the external power supply than in the case of the fourth embodiment.

Therefore, the noise generated in the VCC-power-supply line 35 due to operation of the internal circuits 25 to 30 is further prevented from influencing the increased voltage stabilizing capacitors 40 to 43 as compared with the fourth embodiment. Accordingly, the voltage fluctuation of the increased voltage SVCC due to the noise generated in the VCC-power-supply line 35 may be reduced as compared with the fourth embodiment.

Also in the fifth embodiment, in the same way as the second embodiment, between the VCC-power-supply line 35 and the VSS-power-supply line 36, the high potential stabilizing capacitors 62 to 65 may be provided.

Further, the present invention is not limited to these embodiments, but other variations and modifications may be made without departing from the scope of the present invention.

What is claimed is:

1. A semiconductor device comprising:
   an increase voltage generation circuit generating an increased voltage having a higher potential than a high potential of a power-supply voltage externally supplied; and
   an increase voltage stabilizing capacitor, connected between said increased voltage and said high potential of the power-supply voltage, so that said increased voltage is stabilized, an applied voltage provided to said increased voltage stabilizing capacitor being reduced by the power-supply voltage as compared to a voltage provided to said increased voltage stabilizing capacitor which is connected between said increased voltage and a low potential of said power supply voltage.

2. The semiconductor device as claimed in claim 1, wherein said increased voltage stabilizing capacitor is provided between a first electrode of a conductive layer and a second electrode of a semiconductor region placed under said conductive layer, said semiconductor region being in an inversion state.

3. The semiconductor device as claimed in claim 2, wherein said increased voltage stabilizing capacitor comprises an insulating-gate-type FET, a gate electrode of the FET corresponding to said first electrode of the conductive layer, at least one of source and drain electrodes of the FET corresponding to said second electrode of the semiconductor region.

4. The semiconductor device as claimed in claim 3, wherein said insulating-gate-type FET is a depletion-type FET.

5. The semiconductor device as claimed in claim 1, wherein said increased voltage stabilizing capacitor is provided between a first electrode of a conductive layer and a second electrode of a semiconductor region placed under said conductive layer, said semiconductor region being in an accumulation state.

6. The semiconductor device as claimed in claim 1, wherein said increased voltage stabilizing capacitor further comprises:
   one port connected to an increase voltage line for supplying said increased voltage; and
   another port connected to a position in a high-potential power-supply line, said position being adjacent to an internal port being provided with said high potential of the power-supply voltage.

7. The semiconductor device as claimed in claim 1, wherein said semiconductor device further comprises a high-potential stabilizing capacitor for stabilizing said high potential of the power-supply voltage, said high-potential stabilizing capacitor being connected between a high-potential power-supply line for supplying said high potential of the power-supply voltage and a low-potential power-supply line for supplying low potential of the power-supply voltage.

8. The semiconductor device as claimed in claim 1, wherein said increased voltage stabilizing capacitor comprises:
   one port connected to an increase voltage line for supplying said increased voltage; and
   another port connected to an internal port for being provided with the high potential of the power-supply voltage, through a high-potential power-supply line provided for said increased voltage stabilizing capacitor.

9. The semiconductor device as claimed in claim 1, wherein said increased voltage stabilizing capacitor comprises:
   one port connected to an increase voltage line for supplying said increased voltage; and
   another port connected to an internal port which is provided for said increased voltage stabilizing capacitor and is provided with the high potential of the power-supply voltage, through a high-potential power-supply line provided for said increased voltage stabilizing capacitor.

10. The semiconductor device as claimed in claim 9, wherein said semiconductor device further comprises a lead branch of a lead for said high potential of the power-supply voltage, said lead branch being provided for the increased voltage stabilizing capacitor, and being connected to said internal port provided for said increased voltage stabilizing capacitor and is provided with the high potential of the power-supply voltage.

11. A semiconductor device comprising:
    an increase voltage generation circuit, coupled to a power supply having a first potential and a second potential which is greater than the first potential, to provide, as an output, an increased voltage having a third potential which is greater than the second potential;
    an increased voltage stabilizing capacitor, coupled to the output of said increase voltage generation circuit and the second potential of the power supply voltage, so that destruction of said increased voltage stabilizing capacitor is prevented.

12. The semiconductor device as claimed in claim 11, further comprising a high potential stabilizing capacitor coupled between the second potential and the first potential of the power supply voltage.

* * * * *